United States Patent
Raj (10) Patent No.: US 12,413,241 B2
(45) Date of Patent: Sep. 9, 2025

(54) DIGITAL-TO-ANALOG (DAC) CONVERTER

(71) Applicant: Microchip Technology Incorporated, Chandler, AZ (US)

(72) Inventor: Naveen Raj, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 117 days.

(21) Appl. No.: 18/427,585

(22) Filed: Jan. 30, 2024

(65) Prior Publication Data
US 2025/0088199 A1 Mar. 13, 2025

Related U.S. Application Data

(60) Provisional application No. 63/581,156, filed on Sep. 7, 2023.

(51) Int. Cl.
*H03M 1/66* (2006.01)

(52) U.S. Cl.
CPC .................... *H03M 1/662* (2013.01)

(58) Field of Classification Search
CPC .......... H03M 1/662; H03M 1/68; H03M 1/74; H03M 1/0612; H03M 1/066; H03M 1/66; H03M 1/687; H03M 3/464; H03M 3/502; H03M 1/0604; H03M 1/0665; H03M 1/0675; H03M 1/069; H03M 1/46; H03M 1/742; H03M 1/745; H03M 1/00; H03M 1/002; H03M 1/06; H03M 1/0617; H03M 1/0624; H03M 1/0626; H03M 1/0641; H03M 1/0658; H03M 1/067; H03M 1/0673; H03M 1/0678; H03M 1/08; H03M 1/0854; H03M 1/10; H03M 1/1004;
(Continued)

(56) References Cited

U.S. PATENT DOCUMENTS 6,697,004 B1 * 2/2004 Galton .................. H03M 1/066
341/143
6,819,276 B1 * 11/2004 Hossack ............. H03M 1/0673
341/143
(Continued)

OTHER PUBLICATIONS

International Search Report and Written Opinion, Application No. PCT/US2024/018843, 18 pages, Jun. 17, 2024.

*Primary Examiner* — Linh V Nguyen
(74) *Attorney, Agent, or Firm* — SLAYDEN GRUBERT BEARD PLLC (57) ABSTRACT

A digital-to-analog converter (DAC) system includes a first DAC circuitry and a second DAC circuitry. An input splitter circuitry connected to the DAC system receives a first digital input code, and based on a value of the first digital input code, transfers the first digital input code to the first DAC circuitry for conversion to an analog output signal. The input splitter receives a second digital input code, and based on a value of the second digital input code, divides the second digital input code into a primary component and a secondary component, transfers the primary component to the first DAC circuitry for conversion to an analog output signal primary component, and transfers the secondary component to the second DAC circuitry for conversion to an analog output signal secondary component. An adding circuitry combines the analog output signal primary component and secondary component to provide a combined analog output signal.

20 Claims, 5 Drawing Sheets

(58) Field of Classification Search
CPC ............. H03M 1/1009; H03M 1/1028; H03M 1/1033; H03M 1/1057; H03M 1/1095; H03M 1/181; H03M 1/664; H03M 1/682; H03M 1/70; H03M 1/747; H03M 3/30; H03M 3/368; H03M 3/384; H03M 3/412; H03M 3/424; H03M 3/434; H03M 3/438; H03M 3/444; H03M 3/456; H03M 3/458; H03M 3/50; H03M 3/504; H03M 7/3011; H03M 7/3013; H03M 7/3017; H03M 7/3022; H03M 7/3042
USPC .................................................. 341/144, 145
See application file for complete search history.

(56) References Cited

U.S. PATENT DOCUMENTS

| | | | | |
|---|---|---|---|---|
| 6,919,833 | B2* | 7/2005 | Mills | H03M 1/0643 |
| | | | | 341/118 |
| 7,893,856 | B2* | 2/2011 | Ek | H03M 1/0678 |
| | | | | 341/145 |
| 9,130,586 | B1* | 9/2015 | Raz | H03M 1/662 |
| 9,379,728 | B1 | 6/2016 | Singh et al. | |
| 9,577,657 | B1* | 2/2017 | Clara | H03M 3/38 |
| 9,716,508 | B1 | 7/2017 | Zhang | |
| 9,735,799 | B1* | 8/2017 | Nguyen | H03M 1/06 |
| 11,637,560 | B2 | 4/2023 | Clara et al. | |
| 2016/0134302 | A1* | 5/2016 | Schafferer | H03M 3/458 |
| | | | | 341/120 |
| 2018/0159548 | A1* | 6/2018 | Schmidt | H03M 1/662 |
| 2023/0275596 | A1* | 8/2023 | Engel | H03M 1/1004 |
| 2024/0039547 | A1* | 2/2024 | Nguyen | H03M 1/662 |
| 2024/0223198 | A1* | 7/2024 | Gruber | H03M 1/10 |
| 2024/0283461 | A1 | 8/2024 | Raj | |

* cited by examiner

DIGITAL-TO-ANALOG (DAC) CONVERTER

RELATED APPLICATION

This application claims priority to commonly owned U.S. Provisional Patent Application No. 63/581,156 filed Sep. 7, 2023, the entire contents of which are hereby incorporated by reference for all purposes.

TECHNICAL FIELD

The present disclosure relates to a digital-to-analog converter (DAC).

BACKGROUND

A digital-to-analog converter (DAC) is commonly used to convert a digital signal to an analog signal. A digital input signal provided to the DAC includes a series of samples, referred to herein as digital input codes. Each digital input code includes a number of bits representing a digital value. The number of bits in respective digital input codes is referred to as the "bit depth," which typically corresponds to the "resolution" of the DAC. The resolution of the DAC indicates the number of discrete steps (e.g., voltage steps) the DAC can utilize for respective analog output signals.

The accuracy of a DAC can be described as a function of DAC output errors, for example including Differential Non-Linearity (DNL) errors and/or Integral Non-Linearity (INL) errors. DNL is a measure of deviation (error) of analog output signals from an ideal output step height (1 least significant bit (LSB)) for a given input. INL is a measure of deviation (error) of analog output signals from an ideal straight-line slope for the respective DAC. DAC output errors are typically inherent to the architecture of the respective DAC, and typically cannot be fully eliminated through calibration.

With some DACs, the presence and/or magnitude of DAC output errors (or output errors, for convenience) are often dependent on the bit depth of the respective DAC and the respective digital input code value. For example, in certain 12-bit DACs, output errors are often greater for digital input code values 1023, 2047, 3071, and 4095 and nearby digital input code values.

There is a need for DACs with improved accuracy.

SUMMARY

The present disclosure provides a system including a first DAC circuitry and a second DAC circuitry for converting digital input codes to analog output signals with improved accuracy. The first DAC circuitry and second DAC circuitry may comprise a first DAC channel and a second DAC channel, respectively, of a multi-channel DAC. The system may selectively utilize the first DAC circuitry (e.g., first DAC channel) and second DAC circuitry (e.g., second DAC channel) depending on the respective values of respective digital input codes. In some examples, the system may (a) utilize the first DAC circuitry (e.g., first DAC channel) to convert digital input codes specified as low-error digital input codes and (b) utilize both the first DAC circuitry (e.g., first DAC channel) and the second DAC circuitry (e.g., second DAC channel) to convert digital input codes specified as high-error digital input codes.

For a respective high-error digital input code, the system may divide the high-error digital input code into a primary component and a secondary component, use the first DAC circuitry to convert the primary component to an analog output signal primary component, use the second DAC circuitry to convert the secondary component to an analog output signal secondary component, and combine the analog output signal primary component and analog output signal secondary component to provide a combined analog output signal. The analog output signal primary component and analog output signal secondary component may be combined using an op-amp, a Schottky diode, or other adding circuitry. The combined analog output signal may have a lower error than an error that would result from converting the undivided high-error digital input code using only the first DAC circuitry or using only the second DAC circuitry.

One aspect provides a system including a DAC system to process a digital input signal including a series of digital input codes, the DAC system comprising a first DAC circuitry and a second DAC circuitry. The system includes an input splitter circuitry connected to the DAC system to receive a first digital input code of the series of digital input codes, the first digital input code having a first value, and based on the first value of the received first digital input code, transfer the first digital input code to the first DAC circuitry. The input splitter further to receive a second digital input code of the series of digital input codes, the second digital input code having a second value different than the first value and based on the second value of the received second digital input code: divide the second digital input code into (a) a second digital input code primary component and (b) a second digital input code secondary component, transfer the second digital input code primary component to the first DAC circuitry, and transfer the second digital input code secondary component to the second DAC circuitry. The first DAC circuitry comprises circuitry to convert the first digital input code to a first analog output signal, and convert the second digital input code primary component to a second analog output signal primary component. The second DAC circuitry comprising circuitry to convert the second digital input code secondary component to a second analog output signal secondary component. The system includes an adding circuitry, connected with the first DAC circuitry and the second DAC circuitry, to combine the second analog output signal primary component and the second analog output signal secondary component to provide a combined second analog output signal.

In some examples, the adding circuitry comprises an operational amplifier.

In some examples, the adding circuitry comprises a Schottky diode. In some examples, the value of the second digital input code secondary component is determined based at least on a voltage drop across the Schottky diode.

In some examples, the input splitter circuitry to receive a third digital input code of the series of digital input codes, the third digital input code having a third value greater than the second value of the second digital input code, and based on the third value of the third digital input code, divide the third digital input code into (a) a third digital input code primary component having the same value as the second digital input code primary component of the second digital input code and (b) a third digital input code secondary component having a greater value than the second digital input code secondary component of the second digital input code.

In some examples, the input splitter circuitry stores or has access to at least one high-error input code range, and the input splitter circuitry to: determine the first value of the received first digital input code is not included in the at least one high-error input code range, and in response, to transfer the received first digital input code to the first DAC circuitry; and determine the second value of the received second digital input code is included in a respective high-error input code range of the at least one high-error input code range, and in response, to divide the second digital input code into (a) the second digital input code primary component and (b) the second digital input code secondary component.

In some examples, the second digital input code primary component of the second digital input code is defined with a value preceding the respective high-error input code range, and the second digital input code secondary component is determined based on a difference between the second digital input code and the second digital input code primary component.

In some examples, a same reference voltage is applied to both the first DAC circuitry and the second DAC circuitry.

In some examples, a first reference voltage is applied to the first DAC circuitry, and a second reference voltage different from the first reference voltage is applied to the second DAC circuitry.

One aspect provides a method including receiving a digital input signal including a series of digital input codes including (a) a first digital input code not included in a high-error input code range and (b) a second digital input code included in the high-error input code range; determining by an input splitter circuitry that the first digital input code is not included in the high-error input code range, and in response, converting the first digital input code, by a first DAC circuitry, to a first analog output signal; determining by the input splitter circuitry that the second digital input code is included in the high-error input code range, and in response: dividing the second digital input code into a second digital input code primary component and a second digital input code secondary component, converting by the first DAC circuitry the second digital input code primary component to a second analog output signal primary component, converting by a second DAC circuitry that the second digital input code secondary component to a second analog output signal secondary component, and combining, by an adding circuitry connected with the first DAC circuitry and the second DAC circuitry, the second analog output signal primary component and the second analog output signal secondary component to provide a combined second analog output signal.

In some examples, the adding circuitry comprises an operational amplifier.

In some examples, the adding circuitry comprises a Schottky diode, and the second digital input code secondary component is determined based at least on a voltage drop across the Schottky diode.

In some examples, the method includes receiving a third digital input code of the series of digital input codes, the third digital input code having a greater value than the second digital input code, and determining by the input splitter circuitry that the third digital input code is included in the high-error input code range, and in response: dividing the third digital input code into (a) a third digital input code primary component having the same value as the second digital input code primary component of the second digital input code and (b) a third digital input code secondary component having a greater value than the second digital input code secondary component of the second digital input code, converting by the first DAC circuitry the third digital input code primary component to a third analog output signal primary component, converting by the second DAC circuitry the third digital input code secondary component to a third analog output signal secondary component, and combining by the adding circuitry the third analog output signal primary component and the third analog output signal secondary component to provide a combined third analog output signal.

In some examples, the second digital input code primary component of the second digital input code is defined by a highest value of a low-error input code range preceding the high-error input code range, and the second digital input code secondary component is determined based on a difference between the second digital input code and the second digital input code primary component.

In some examples, the adding circuitry comprises a Schottky diode, and the second digital input code secondary component is determined based on (a) the difference between the second digital input code and the second digital input code primary component and (b) a voltage drop across the Schottky diode.

One aspect provides a system including non-transitory memory storing at least one high-error input code range. The system further includes circuitry to receive a series of digital input codes; determine whether respective digital input codes is included in the stored at least one high-error input code range; for a first digital input code determined not to be in the at least one high-error input code range, use a first DAC circuitry to convert the respective digital input code to a first analog output signal; and for a second digital input code determined to be in the at least one high-error input code range: divide the second digital input code into (a) a second digital input code primary component and (b) a second digital input code secondary component, use the first DAC circuitry to convert the second digital input code primary component to a second analog output signal primary component, use the second DAC circuitry to convert the second digital input code secondary component to a second analog output signal secondary component, and use an adding circuitry to combine the second analog output signal primary component and the second analog output signal secondary component to provide a combined second analog output signal.

In some examples, the non-transitory memory stores multiple high-error input code ranges separated by respective non-high-error input code ranges.

In some examples, the adding circuitry comprises an operational amplifier.

In some examples, the adding circuitry comprises a Schottky diode.

In some examples, the second digital input code secondary component is determined based at least on a voltage drop across the Schottky diode.

DESCRIPTION OF THE DRAWINGS

Example aspects of the present disclosure are described below in conjunction with the figures, in which.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1:
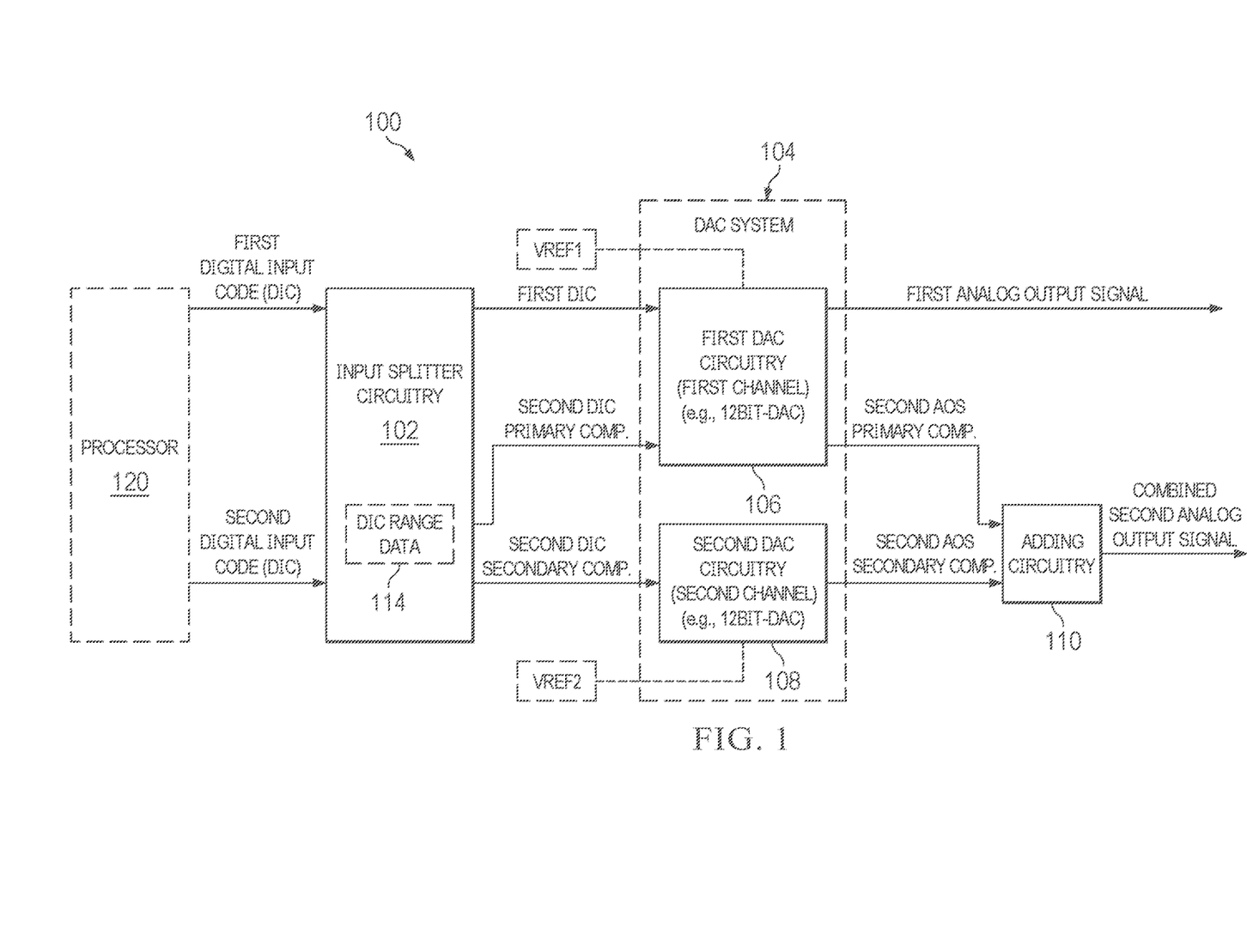
FIG. 1 shows an example system for converting digital signals to analog signals, e.g., using a multi-channel DAC.

FIG. 1 shows an example system 100 for converting digital signals to analog signals. The example system 100 includes an input splitter circuitry 102 to process a series of digital input codes, a DAC system 104 including a first DAC circuitry 106 and a second DAC circuitry 108 to selectively process respective digital input codes, and an adding circuitry 110 to combine respective outputs of the first DAC circuitry 106 and a second DAC circuitry 108 as discussed below. In some examples, the first DAC circuitry 106 and second DAC circuitry 108 may comprise a first DAC channel and a second DAC channel, respectively, of a multi-channel DAC system 104.

The input splitter circuitry 102 may include circuitry to receive the series of digital input codes from a processor 120 (e.g., a central processing unit (CPU), microprocessor, or microcontroller), or other source of digital data. Respective digital input codes in the series of digital input codes have respective values, e.g., represented in binary. The input splitter circuitry 102 may include circuitry to selectively utilize the first DAC circuitry 106 and/or second DAC circuitry 108 to process respective digital input codes (i.e., to convert the respective digital input codes to respective analog output signals) as a function of the respective values of the respective digital input codes. For example, the input splitter circuitry 102 may include circuitry to selectively divide or not divide respective digital input codes received at the input splitter circuitry 102, wherein respective digital input codes not divided by the input splitter circuitry 102 (referred to herein as "undivided digital input codes") are processed by the first DAC circuitry 106, and respective digital input codes divided by the input splitter circuitry 104 (referred to herein as "divided digital input codes") are jointly processed by the first DAC circuitry 106 and the second DAC circuitry 108. As used herein, the words "split" and "divide" (and other forms thereof) are used synonymously.

In some examples, the input splitter circuitry 102 may be implemented in software, firmware, or other logic instructions stored in non-transitory computer-readable media and executable by a processor, or alternatively may be implemented in suitable hardware.

Figure 2:
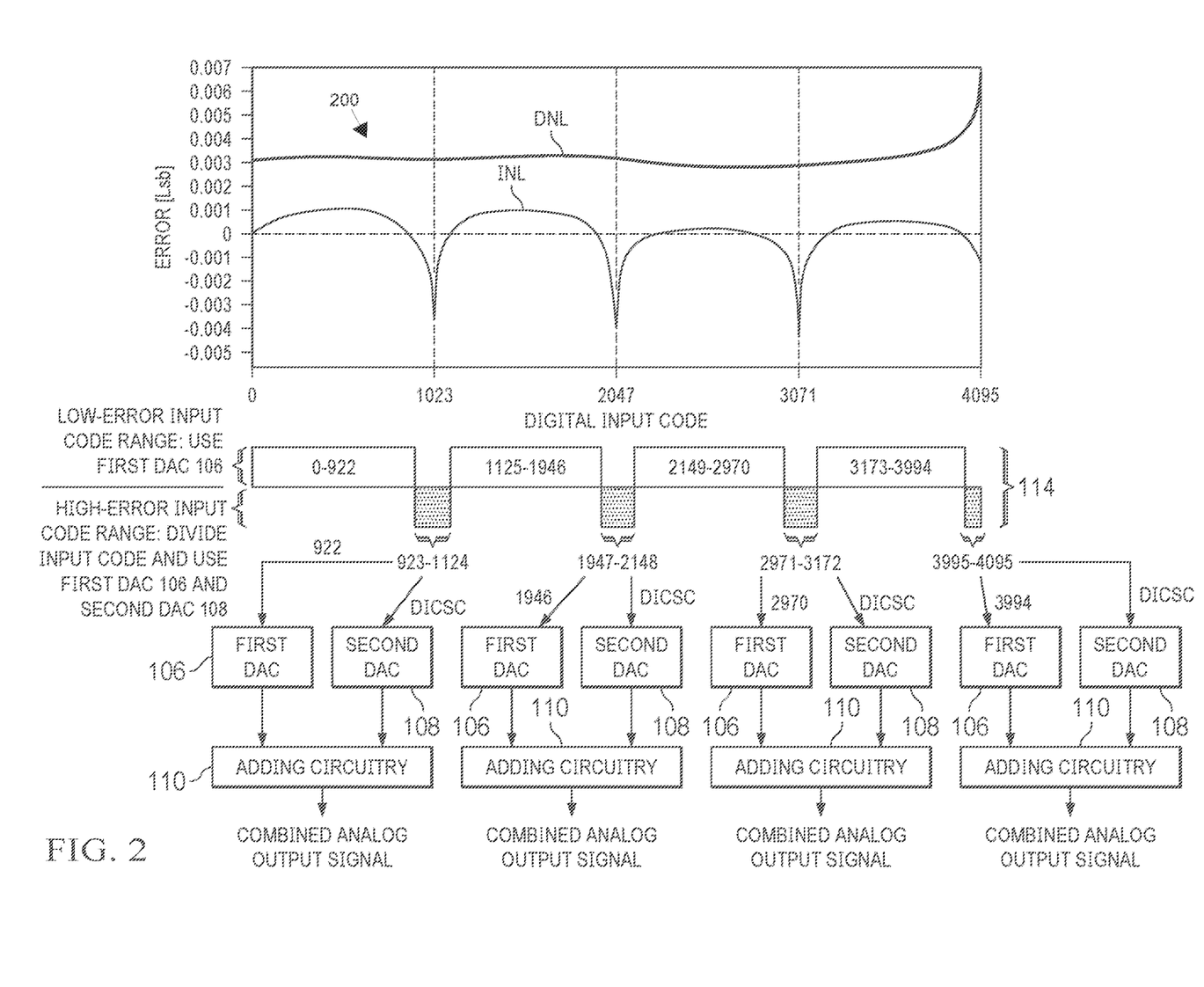
FIG. 2 illustrates an example operation of the example system shown in FIG. 1.

In some examples, the input splitter circuitry 104 may selectively divide or not divide respective digital input codes as a function of the respective values of the respective digital input codes, for example to avoid the first DAC circuitry 106 operating in a high-error range for digital input code values. It may be known (e.g., based on testing or product documentation of the first DAC circuitry 106, or otherwise known) that the first DAC circuitry 106 imparts higher error rates on some range(s) of digital input code values than other range(s) of digital input code values, when converting respective digital input code values to respective analog signals. For example, as shown in FIG. 2 discussed below, an example 12-bit DAC (capable of processing digital input code values from 0-4095) may have an error profile 200 indicating higher error rates (e.g., DNL and/or INL error rates) for certain ranges of digital input code values, for example digital input code values near 1023, 2047, 3071, and 4095. Ranges of high-error digital input code values (i.e., exhibiting higher error than other ranges of digital input code values) may be referred to herein as "high-error input code ranges," and other ranges of digital input code values (i.e., digital input code values not included in a high-error input code range) may be referred to herein as "low-error input code ranges," wherein low-error input code ranges are distinct from high-error input code ranges. Referring to the example error profile 200 shown in FIG. 2, a respective high-error input code range of ±100 values may be defined around values 1023, 2047, and 3071 (exhibiting high INL error), and a respective high-error input code range of 100 values may be defined preceding 4095 (exhibiting high DNL error), to thereby define the following input code ranges for the example 12-bit DAC associated with the example error profile 200:

0-922: low-error input code range;
923-1124: high-error input code range;
1125-1946: low-error input code range;
1947-2148: high-error input code range
2149-2970: low-error input code range;
2971-3172: high-error input code range
3173-3994: low-error input code range; and
3995-4095: high-error input code range.

Respective high-error input code ranges and/or low-error input code ranges may be determined and/or defined for the first DAC circuitry 106 based on testing, product documentation, or in any other manner. In some examples, parameters for defining the extent (e.g., beginning and end values) of a respective high-error input code range, e.g., threshold error rates, or a predefined range width (e.g., ±100 values on both sides of a digital input code exhibiting a local maximum error rate), may be selected or determined in any suitable manner, e.g., specified by a user or automatically determined according by input splitter circuitry 102.

Respective high-error input code range(s) (and optionally, respective low-error input code range(s)) defined for the first DAC circuitry 106 may be stored in memory as digital input code range data 114, e.g., in memory provided in the input splitter circuitry 102 or other memory accessible by the input splitter circuitry 102. The input splitter circuitry 102 may use such digital input code range data 114 to determine whether or not to divide respective digital input codes in a series of digital input codes received at the input splitter circuitry 102 (e.g., from processor 120).

In some examples, the second DAC circuitry 108 may have a similar error profile 200 as the first DAC circuitry 106, for example wherein the first DAC circuitry 106 and the second DAC circuitry 108 have the same bit depth (e.g., both 12-bit DACs). In some examples, the first DAC circuitry 106 and the second DAC circuitry 108 may comprise two instances of an array of similar DACs produced on a common wafer or panel.

In some examples, for respective received digital input codes, the input splitter circuitry 102 may determine whether the received digital input code is included in a high-error input code range specified in digital input code range data 114. For example, for a respective received digital input code, the input splitter circuitry 102 may determine, based on digital input code range data 114, whether the respective digital input code is included in a high-error input code range. If the respective digital input code is not included in a high-error input code range, the input splitter circuitry 102 may transfer the respective digital input code to the first DAC circuitry 106 for conversion to a respective analog output signal, abbreviated as "AOS" in the drawings. Alternatively, if the respective digital input code is included in the high-error input code range, the input splitter circuitry 102 may divide the respective digital input code into (a) a digital input code primary component and (b) a digital input code secondary component, transfer the digital input code primary component to the first DAC circuitry 106 for conversion to an analog output signal primary component, and transfer the digital input code secondary component to the second DAC circuitry 108 for conversion to an analog output signal secondary component, wherein the analog output signal primary component and the analog output signal secondary component are transferred to, and combined by, the adding circuitry 110 to provide a combined analog output signal.

FIG. 1 shows example processing of two example digital input codes received at the input splitter circuitry 102 (e.g., from processor 120), namely a first digital input code and a second digital input code. In the illustrated example, as defined by digital input code range data 114, the first digital input code is included in a first range of digital input code values not designated as a high-error input code range, and the second digital input code is included in a second range of digital input code values (distinct from the first range of digital input code values) designated as a high-error input code range. In other words, the first digital input code is not designated as a high-error digital input code, i.e. the first digital input code is designated in digital input code range data 114 as in the low-error input code range, while the second digital input code is designated as a high-error digital input code, i.e. the second digital input code is designated in digital input code range data 114 as in the high-error input code range. For illustrative purposes, it is assumed for the following discussion that the second range of digital input code values sequentially follows the first range of digital input code values. For example, according to the input code ranges listed above, the first digital input code may have a value (e.g., 1527) included in the defined input code range 1125-1946 (low-error input code range), and the second digital input code may have a value (e.g., 2032) included in the defined input code range 1947-2148 (high-error input code range).

For the received first digital input code (value=1527), the input splitter circuitry 104 may determine (e.g., based on digital input code range data 114) that the first digital input code is included in the low-error input code range 1125-1946, and in response, transfer the first digital input code to the first DAC circuitry 106. The first DAC circuitry 106 may convert the first digital input code to a first analog output signal, as indicated in FIG. 1.

For the received second digital input code (value=2032), the input splitter circuitry 104 may determine (e.g., based on digital input code range data 114) that the second digital input code is included in the high-error input code range 1947-2148, and in response, divide the second digital input code into (a) a second digital input code primary component and (b) a second digital input code secondary component. In some examples, the second digital input code primary component may comprise the highest value of the low-error input code range immediately preceding the high-error input code range in which the second digital input code is included. The second digital input code secondary component may comprise the difference between the second digital input code and the second digital input code primary component, i.e., wherein the sum of the second digital input code primary component and the second digital input code secondary component is the second digital input code. Thus, in the present example, the input splitter circuitry 104 may divide the second digital input code (value=2032) into (a) a second digital input code primary component having a value of 1946 (i.e., the highest value of the low-error input code range 1125-1946) and (b) a second digital input code secondary component having a value of 86 (i.e., 2032 minus 1946).

As shown in FIG. 1, the input splitter circuitry 104 may (a) transfer the second digital input code primary component to the first DAC circuitry 106, which converts the second digital input code primary component to a second analog output signal primary component (a base voltage), and (b) transfer the second digital input code secondary component to the second DAC circuitry 108, which converts the second digital input code secondary component to a second analog output signal secondary component (a supplemental voltage). As shown in FIG. 1, the first DAC circuitry 106 and second DAC circuitry 108 may operate in parallel.

The second analog output signal primary component and second analog output signal secondary component may be transferred to the adding circuitry 110, which may combine the second analog output signal primary component and the second analog output signal secondary component to provide a combined second analog output signal, as shown in FIG. 1.

By dividing the second digital input code, which second digital input code is designated in digital input code range data 114 as in the high-error input code range, into the second digital input code primary component (value=1946) and the second digital input code secondary component (value=86), the first DAC circuitry 106 may avoid operating in its high-error input code range of 1947-2148. In addition, the second DAC circuitry 108, which may have a similar error profile as the first DAC circuitry 106 as discussed above, may also avoid operating in a high-error input code range. For clarity, high-error digital input codes are those digital input codes in a respective high-error input code range as designated in digital input code range data 114; and low-error digital input codes are those digital input codes in a respective low-error input code range as designated in digital input code range data 114. In one example, digital input code range data 114 may indicate the high-error input code ranges, with codes outside of the high-error input code ranges understood to be in the low-error input code ranges. In one example, digital input code range data 114 may indicate the low-error input code ranges, with codes outside of the low-error input code ranges understood to be in the high-error input code ranges.

As a result of the processing discussed above, the combined second analog output signal generated by the system 100 may have a smaller error than an error that would be produced by the first DAC circuitry 106 converting the full second digital input code (value=2032).

As shown in FIG. 1, the first DAC circuitry 106 may use a first reference voltage $V_{REF1}$ and the second DAC circuitry 108 may use a second reference voltage $V_{REF2}$. In some examples, both the first DAC circuitry 106 and the second DAC circuitry 108 may use the same reference voltage (i.e., $V_{REF1}=V_{REF2}$), e.g., to provide a linear output. In other examples, the first DAC circuitry 106 and second DAC circuitry 108 may use difference reference voltages (e.g., $V_{REF1}>V_{REF2}$), e.g., to increase DAC resolution, e.g., as disclosed in co-pending U.S. patent application Ser. No. 18/231,371 filed Aug. 8, 2023, the entire contents of which are herein incorporated by reference.

FIG. 2 illustrates an operation of the example system 100 shown in FIG. 1. The top portion of FIG. 2 shows an example error profile 200 of the first DAC circuitry 106, for example wherein the first DAC circuitry 106 is a 12-bit DAC. The example error profile 200 indicates an error rate (measured by least significant bits LSb) as a function of the digital input code processed (converted to analog) by the first DAC circuitry 106, i.e., without splitting any digital input codes according to the present disclosure. As shown, the example error profile 200 defines a local maximums near the digital input code values 1023, 2047, 3071, and 4095.

The middle portion of FIG. 2 (vertically) shows the example low-error input code ranges and high-error input code ranges discussed above, in particular wherein respective high-error input code ranges are defined at 923-1124 (i.e., 1023±100), 1947-2148 (i.e., 2047±100), 2971-3172 (i.e., 3071±100), and 3995-4095 (i.e., 4095±100 but terminating at the maximum value 4095). As shown in this portion of FIG. 2, digital input codes included in a respective low-error input code range are transferred to the first DAC circuitry 106 for processing (i.e., without using the second DAC circuitry 108). In contrast, digital input codes included in a respective high-error input code range are divided into a primary component and a secondary component, the primary component is transferred to the first DAC circuitry 106 for processing, and the secondary component is transferred to the second DAC circuitry 108 for processing, as discussed above with reference to FIG. 1.

The lower portion of FIG. 2 illustrates the processing of high-error digital input codes (i.e., digital input codes in a respective high-error input code range). As shown, a respective high-error digital input code is divided into (a) a digital input code primary component specified as the highest value of the immediately preceding low-error input code range and (b) a digital input code secondary component (indicated as "DISSC" in FIG. 2) is set equal to or otherwise determined based on a difference between the respective high-error digital input code and the digital input code primary component, as discussed below. As shown, the digital input code primary component is transferred to the first DAC circuitry 106, which converts the digital input code primary component to an analog output primary component, the digital input code secondary component is transferred to the second DAC circuitry 108, which converts the digital input code secondary component to an analog output secondary component. The analog components (i.e., the analog output primary component generated by the first DAC circuitry 106 and the analog output secondary component generated by the second DAC circuitry 108) are transferred to the adding circuitry 110, which combines the analog components to provide a combined analog output signal.

The digital input code secondary component for a respective digital input code may be set equal to or otherwise determined based on a difference between the respective high-error digital input code and the digital input code primary component. For example, as discussed below with reference to FIG. 3, in examples in which the adding circuitry 110 comprises an operational amplifier (Op-amp), the digital input code secondary component for a respective digital input code may be set equal to the difference between the respective high-error digital input code and the digital input code primary component, or in other words, digital input code secondary component=digital input code–digital input code primary component. As another example, as discussed below with reference to FIG. 4, in examples in which the adding circuitry 110 comprises a Schottky diode, the digital input code secondary component for a respective digital input code may be set to a value equal to the difference between the respective high-error digital input code and the digital input code primary component (i.e., digital input code–digital input code primary component) adjusted by an offset to compensate for a voltage drop across the Schottky diode.

Figure 3:
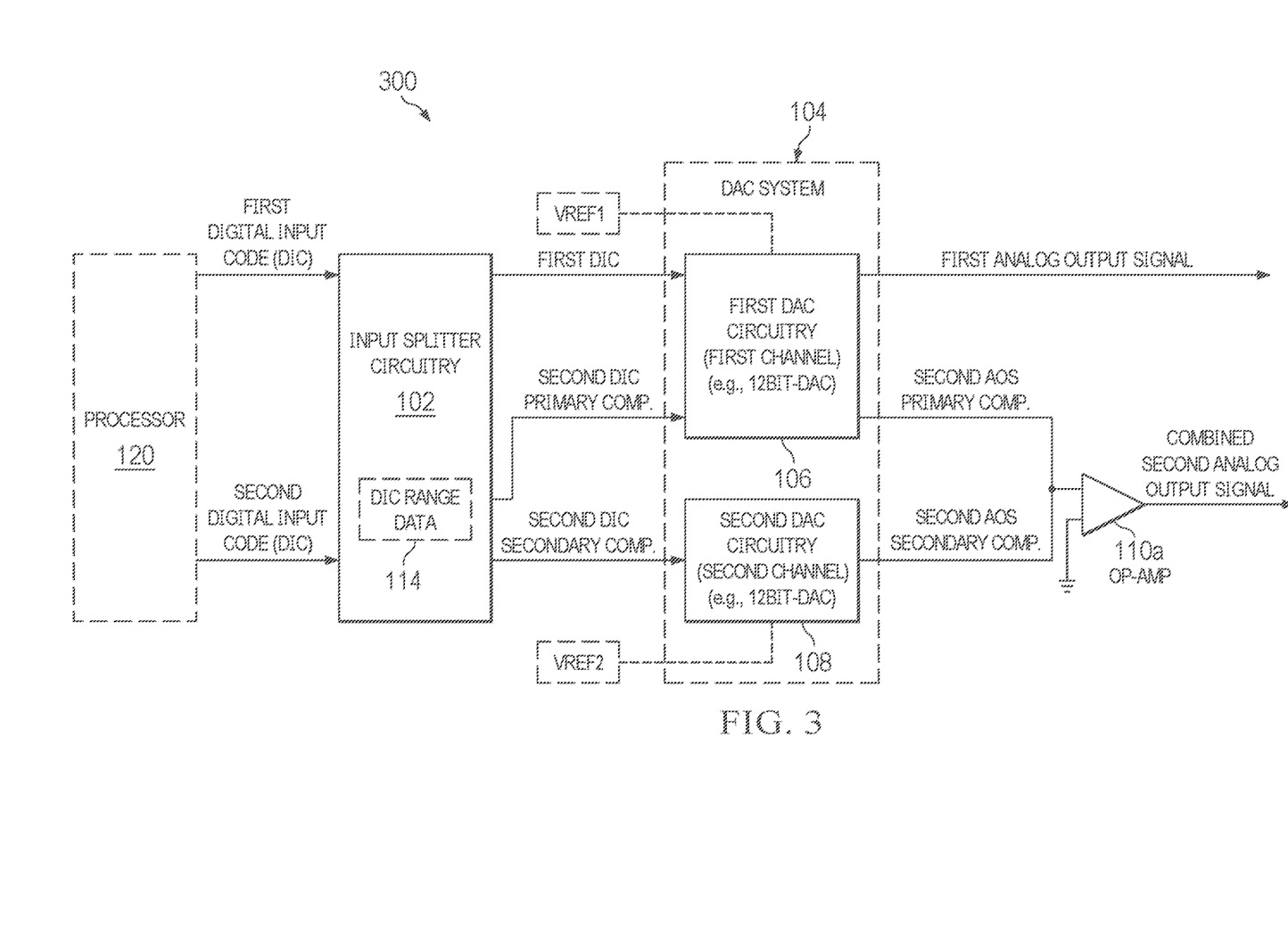
FIG. 3 shows an example system for converting digital signals to analog signals, e.g., using a multi-channel DAC including adding circuitry comprising an operational amplifier (Op-amp)

FIG. 3 shows an example system 300 for converting digital signals to analog signals. The example system 300 is similar to the example system 100 shown in FIG. 1, with like reference numbers representing like parts. Example system 300 includes an operational amplifier (Op-amp) 110a providing the functionality of the adding circuitry 110 of the example system 100 shown in FIG. 1.

The input splitter circuitry 102 may process respective digital input codes (e.g., a series of digital input codes received from processor 120) as discussed above with respect to example system 100. For example, the input splitter circuitry 102 may transfer respective low-error digital input codes to the first DAC circuitry 106 for conversion to respective analog output signals. For respective high-error digital input codes, the input splitter circuitry 102 may divide the respective high-error digital input code into (a) a digital input code primary component and (b) a digital input code secondary component, transfer the digital input code primary component to the first DAC circuitry 106 for conversion to an analog output signal primary component, and transfer the digital input code secondary component to the second DAC circuitry 108 for conversion to an analog output signal secondary component, wherein the analog output signal primary component and the analog output signal secondary component are transferred to, and combined by, the Op-amp 110a (i.e., adding circuitry) to provide a combined analog output signal.

For a respective high-error digital input code, the input splitter circuitry 102 of the example system 300 may (a) designate the digital input code primary component as the highest value of the low-error input code range immediately preceding the respective high-error input code range, and (b) designate the digital input code secondary component as the difference between the respective high-error digital input code and the digital input code primary component, i.e., the respective high-error digital input code minus the digital input code primary component. For example, referring to the example input code ranges shown in FIG. 2, the input splitter circuitry 102 may divide a received digital input code of 3103 (i.e., in the high-error input code range of 2971-3172) into (a) a digital input code primary component of 2970 and (b) a digital input code secondary component of 133 (i.e., 3103 minus 2970).

Figure 4:
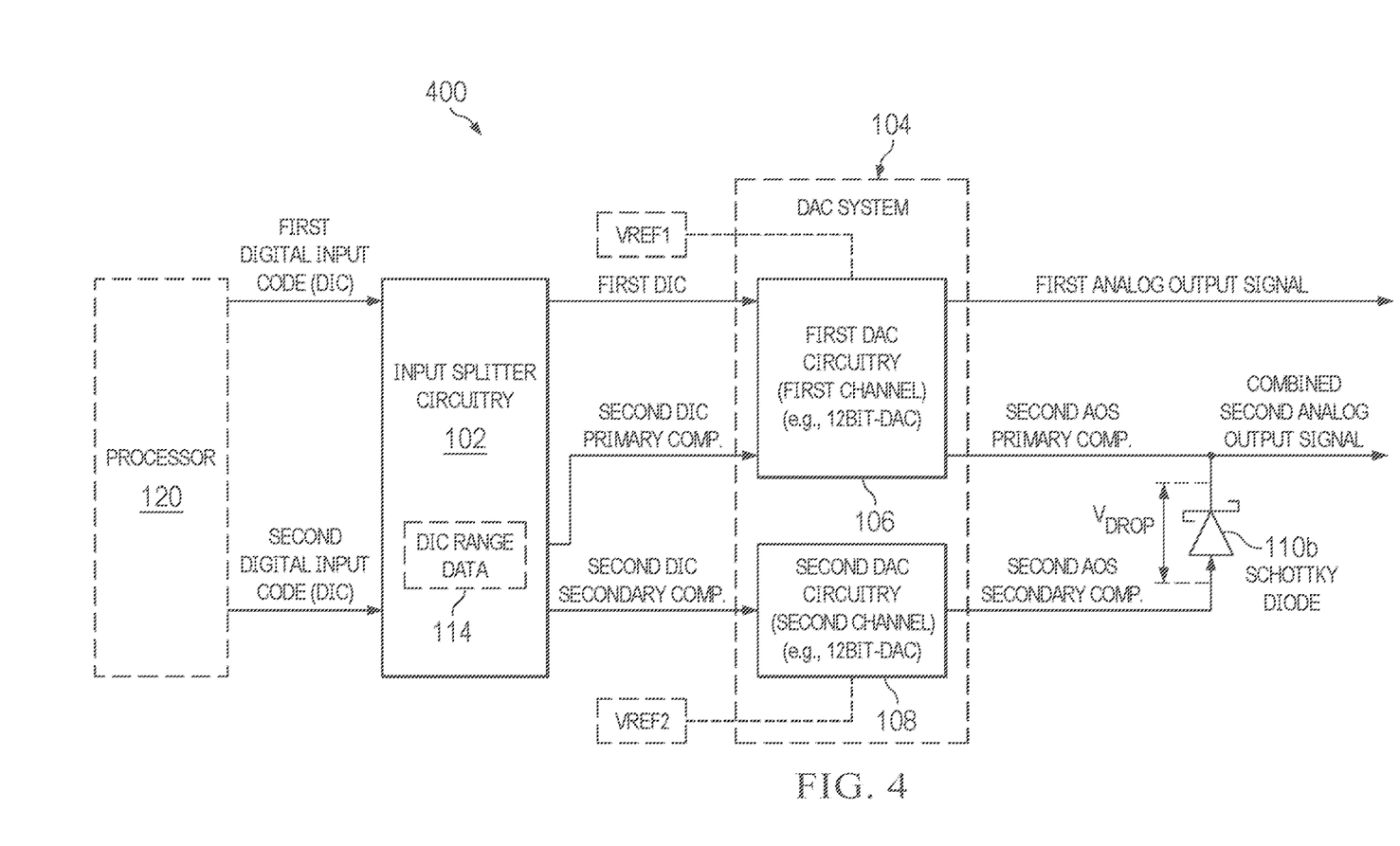
FIG. 4 shows an example system for converting digital signals to analog signals, e.g., using a multi-channel DAC including adding circuitry comprising a Schottky diode.

FIG. 4 shows an example system 400 for converting digital signals to analog signals. The example system 400 is similar to the example system 100 shown in FIG. 1, with like reference numbers representing like parts. In contrast to example system 300 discussed above, the example system 400 shown in FIG. 4 includes a Schottky diode 110b providing the functionality of the adding circuitry 110 of the example system 100 shown in FIG. 1.

The input splitter circuitry 102 may process respective digital input codes as discussed above with respect to example system 100. For example, the input splitter circuitry 102 may transfer respective low-error digital input codes to the first DAC circuitry 106 for conversion to respective analog output signals. For respective high-error digital input codes, the input splitter circuitry 102 may divide the respective high-error digital input code into (a) a digital input code primary component and (b) a digital input code secondary component, transfer the digital input code primary component to the first DAC circuitry 106 for conversion to an analog output signal primary component, and transfer the digital input code secondary component to the second DAC circuitry 108 for conversion to an analog output signal secondary component, wherein the analog output signal primary component and the analog output signal secondary component are transferred to and combined by the Schottky diode 110b (i.e., adding circuitry 110) to provide a combined analog output signal.

For a respective high-error digital input code, the input splitter circuitry 102 of the example system 400 may (a) designate the digital input code primary component as the highest value of the low-error input code range immediately preceding the respective high-error input code range, and (b) determine the digital input code secondary component by (i) determining the difference between the respective high-error digital input code and the digital input code primary component (i.e., the respective high-error digital input code minus the digital input code primary component) and (ii) adding an offset to the determined difference (between the respective high-error digital input code and the digital input code primary component) to compensate for a voltage drop across the Schottky diode. The offset may correspond with a digital input code for which the second DAC circuitry 108 outputs an analog voltage matching the voltage drop across the Schottky diode 110b. For example, for a Schottky diode that exhibits a voltage drop of 0.3V, the offset may be set to a digital input code for which the second DAC circuitry 108 outputs an analog signal of 0.3V.

For example, assume an example implementation in which a voltage drop of 0.3V is measured across the Schottky diode, and further assume the second DAC circuitry 108 outputs an analog voltage of 0.3V for a digital input code of 246. In such example, the input splitter circuitry 102 may determine the digital input code secondary component for a respective high-error digital input code by (i) determining the difference between the respective high-error digital input code and the digital input code primary component and (ii) adding an offset of 246 to the determined difference. For example, referring to the example input code ranges shown in FIG. 2, the input splitter circuitry 102 may divide a received digital input code of 3103 (i.e., in the high-error input code range of 2971-3172) into (a) a digital input code primary component of 2970 and (b) a digital input code secondary component of 379 (i.e., 3103 minus 2970 plus the offset of 246).

Figure 5:
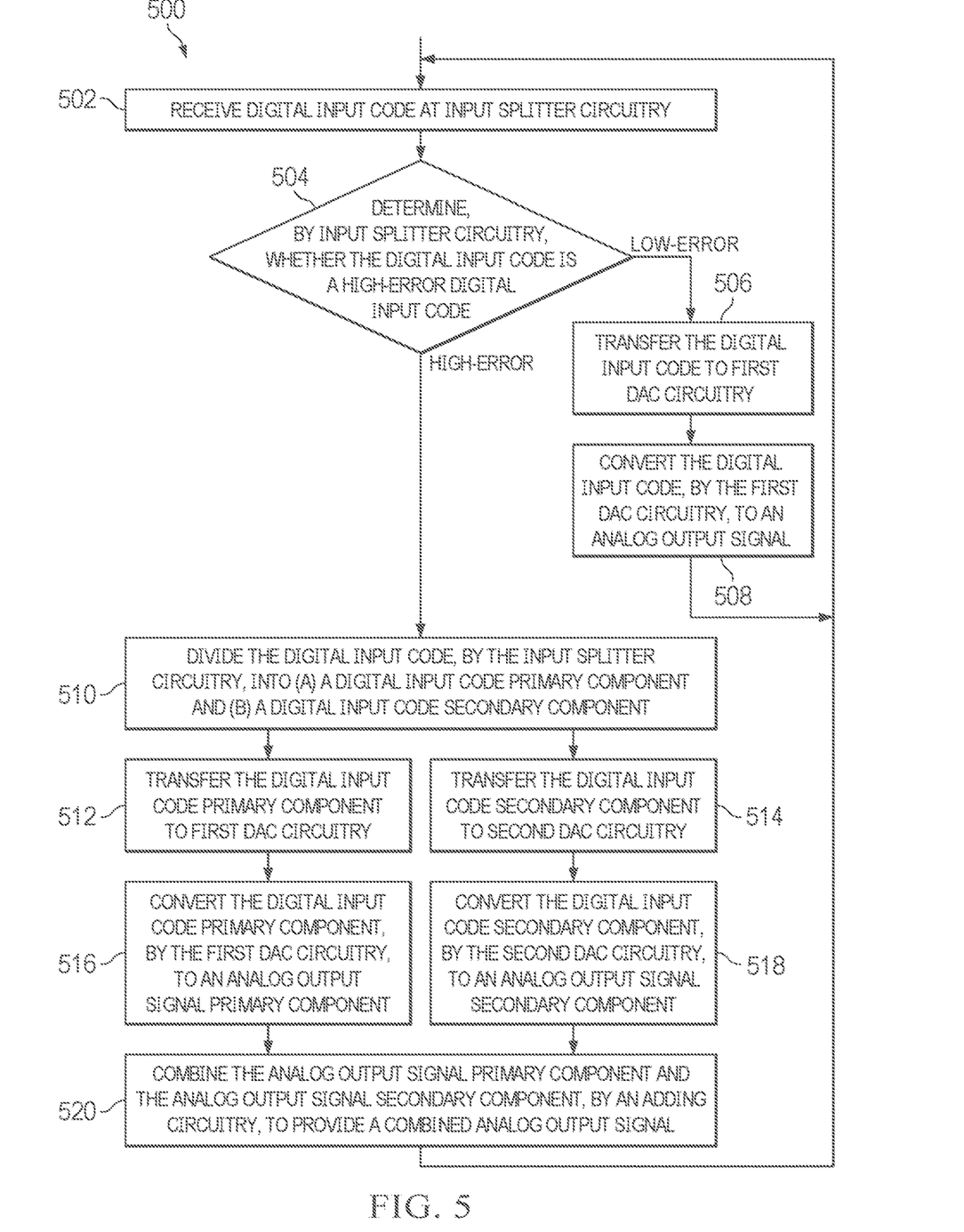
FIG. 5 shows an example method for converting digital signals to analog signals, e.g., using any of the systems disclosed herein.

FIG. 5 shows an example method 500 for converting digital signals to analog signals, for example for converting a series of digital input codes in a series of digital input codes (e.g., received from a processor) to a respective series of analog output signals.

At 502, a digital input code is received at the input splitter circuitry 102, e.g., in a series of digital input codes received from a processor.

At 504, the input splitter circuitry 102 may determine whether the received digital input code is a high-error digital input code, e.g., based on digital input code range data 114 specifying one or more high-error input code ranges and (optionally) one or more low-error input code ranges. For example, the input splitter circuitry 102 may determine whether or not the received digital input code is included in a high-error input code range specified in digital input code range data 114. As another example, in an implementation in which the digital input code range data 114 specifies both high-error input code range(s) and low-error input code range(s), the input splitter circuitry 102 may determine whether the received digital input code is included in a high-error input code range or in a low-error input code range.

If the input splitter circuitry 102 determines the digital input code is a low-error digital input code, at 506 the input splitter circuitry 102 may transfer the digital input code to the first DAC circuitry 106. At 508, the first DAC circuitry 106 may convert the low-error digital input code to a respective analog output signal. The method may then return to 502 to process a next digital input code.

Returning to 504, if the input splitter circuitry 102 alternatively determines the digital input code is a high-error digital input code, at 510 the input splitter circuitry 102 may divide the digital input code into (a) a digital input code primary component and (b) a digital input code secondary component, e.g., based on the specifics of the adding circuitry 110 (e.g., an op-amp 110a or Schottky diode 110b) as discussed above with reference to FIGS. 3 and 4.

At 512, the input splitter circuitry 102 may transfer the digital input code primary component to the first DAC circuitry 106. At 514, the input splitter circuitry 102 may transfer the digital input code secondary component to the second DAC circuitry 108. The operations of 512 and 514 may be performed in parallel.

At 516, the first DAC circuitry 106 may convert the digital input code primary component to an analog output signal primary component. At 518, the second DAC circuitry 108 may convert the digital input code secondary component to an analog output signal secondary component. The operations of 516 and 518 may be performed in parallel.

At 520, the adding circuitry may combine the analog output signal primary component and the analog output signal secondary component to provide a combined analog output signal. The method may then return to 502 to process a next digital input code.

Although example embodiments have been described above, other variations and embodiments may be made from this disclosure without departing from the spirit and scope of these embodiments.

The invention claimed is:

1. A system, comprising:
   a digital-to-analog converter (DAC) system to process a digital input signal including a series of digital input codes, the DAC system comprising:
      a first DAC circuitry; and
      a second DAC circuitry;
   an input splitter circuitry connected to the DAC system to:
      receive a first digital input code of the series of digital input codes, the first digital input code having a first value;
      based on the first value of the received first digital input code, transfer the first digital input code to the first DAC circuitry;
      receive a second digital input code of the series of digital input codes, the second digital input code having a second value different than the first value; and
      based on the second value of the received second digital input code:
         divide the second digital input code into (a) a second digital input code primary component and (b) a second digital input code secondary component;
         transfer the second digital input code primary component to the first DAC circuitry; and
         transfer the second digital input code secondary component to the second DAC circuitry;
   the first DAC circuitry comprising circuitry to:

convert the first digital input code to a first analog output signal;

convert the second digital input code primary component to a second analog output signal primary component; and the second DAC circuitry comprising circuitry to:

convert the second digital input code secondary component to a second analog output signal secondary component; and an adding circuitry, connected with the first DAC circuitry and the second DAC circuitry, to combine the second analog output signal primary component and the second analog output signal secondary component to provide a combined second analog output signal.

2. The system of claim 1, wherein the adding circuitry comprises an operational amplifier.

3. The system of claim 1, wherein the adding circuitry comprises a Schottky diode.

4. The system of claim 3, wherein the value of the second digital input code secondary component is determined based at least on a voltage drop across the Schottky diode.

5. The system of claim 1, wherein the input splitter circuitry to:

receive a third digital input code of the series of digital input codes, the third digital input code having a third value greater than the second value of the second digital input code; and based on the third value of the third digital input code:
divide the third digital input code into:
(a) a third digital input code primary component having the same value as the second digital input code primary component of the second digital input code, and
(b) a third digital input code secondary component having a greater value than the second digital input code secondary component of the second digital input code.

6. The system of claim 1, wherein:

the input splitter circuitry stores or has access to at least one high-error input code range; and the input splitter circuitry to:
determine the first value of the received first digital input code is not included in the at least one high-error input code range, and in response, to transfer the received first digital input code to the first DAC circuitry; and
determine the second value of the received second digital input code is included in a respective high-error input code range of the at least one high-error input code range, and in response, to divide the second digital input code into (a) the second digital input code primary component and (b) the second digital input code secondary component.

7. The system of claim 6, wherein:

the second digital input code primary component of the second digital input code is defined with a value preceding the respective high-error input code range; and the second digital input code secondary component is determined based on a difference between the second digital input code and the second digital input code primary component.

8. The system of claim 1, wherein a same reference voltage is applied to both the first DAC circuitry and the second DAC circuitry.

9. The system of claim 1, wherein a first reference voltage is applied to the first DAC circuitry, and a second reference voltage different from the first reference voltage is applied to second DAC circuitry.

10. A method, comprising:

receiving a digital input signal including a series of digital input codes including (a) a first digital input code not included in a high-error input code range and (b) a second digital input code included in the high-error input code range;

determining, by an input splitter circuitry, that the first digital input code is not included in the high-error input code range, and in response, converting the first digital input code, by a first DAC circuitry, to a first analog output signal;

determining, by the input splitter circuitry, that the second digital input code is included in the high-error input code range, and in response:
dividing the second digital input code into a second digital input code primary component and a second digital input code secondary component;
converting, by the first DAC circuitry, the second digital input code primary component to a second analog output signal primary component;
converting, by a second DAC circuitry, the second digital input code secondary component to a second analog output signal secondary component; and
combining, by an adding circuitry connected with the first DAC circuitry and the second DAC circuitry, the second analog output signal primary component and the second analog output signal secondary component to provide a combined second analog output signal.

11. The method of claim 10, wherein the adding circuitry comprises an operational amplifier.

12. The method of claim 10, wherein:

the adding circuitry comprises a Schottky diode; and the second digital input code secondary component is determined based at least on a voltage drop across the Schottky diode.

13. The method of claim 12, comprising:

receiving a third digital input code of the series of digital input codes, the third digital input code having a greater value than the second digital input code; and determining, by the input splitter circuitry, the third digital input code is included in the high-error input code range, and in response:
dividing the third digital input code into:
(a) a third digital input code primary component having the same value as the second digital input code primary component of the second digital input code, and
(b) a third digital input code secondary component having a greater value than the second digital input code secondary component of the second digital input code;
converting, by the first DAC circuitry, the third digital input code primary component to a third analog output signal primary component;
converting, by the second DAC circuitry, the third digital input code secondary component to a third analog output signal secondary component; and
combining, by the adding circuitry, the third analog output signal primary component and the third analog output signal secondary component to provide a combined third analog output signal.

14. The method of claim 10, wherein:

the second digital input code primary component of the second digital input code is defined by a highest value of a low-error input code range preceding the high-error input code range; and the second digital input code secondary component is determined based on a difference between the second digital input code and the second digital input code primary component.

15. The method of claim 14, wherein:

the adding circuitry comprises a Schottky diode; and the second digital input code secondary component is determined based on (a) the difference between the second digital input code and the second digital input code primary component and (b) a voltage drop across the Schottky diode.

16. A system, comprising:

non-transitory memory storing at least one high-error input code range; and circuitry to:

receive a series of digital input codes;

determine whether respective digital input codes are included in the stored at least one high-error input code range;

for a first digital input code determined not to be in the at least one high-error input code range, use a first digital-to-analog converter (DAC) circuitry to convert the respective digital input code to a first analog output signal; and     for a second digital input code determined to be in the at least one high-error input code range:

divide the second digital input code into (a) a second digital input code primary component and (b) a second digital input code secondary component;

use the first DAC circuitry to convert the second digital input code primary component to a second analog output signal primary component;

use the second DAC circuitry to convert the second digital input code secondary component to a second analog output signal secondary component; and         use an adding circuitry to combine the second analog output signal primary component and the second analog output signal secondary component to provide a combined second analog output signal.

17. The system of claim 16, wherein the non-transitory memory stores multiple high-error input code ranges separated by respective non-high-error input code ranges.

18. The system of claim 16, wherein the adding circuitry comprises an operational amplifier.

19. The system of claim 16, wherein the adding circuitry comprises a Schottky diode.

20. The system of claim 19, wherein the second digital input code secondary component is determined based at least on a voltage drop across the Schottky diode.

* * * * *